United States Patent
Lee et al.

(10) Patent No.: US 7,889,555 B2
(45) Date of Patent: Feb. 15, 2011

(54) FLASH MEMORY SYSTEM CAPABLE OF OPERATING IN A RANDOM ACCESS MODE AND DATA READING METHOD THEREOF

(75) Inventors: Byeong-Hoon Lee, Seoul (KR);
Ki-Hong Kim, Suwon-si (KR);
Seung-Won Lee, Seongnam-si (KR);
Sun-Kwon Kim, Suwon-si (KR)

(73) Assignee: Samsung Electronics Co., Suwon-Si, Gyeonggi-Do (KR)

( * ) Notice: Subject to any disclaimer, the term of this patent is extended or adjusted under 35 U.S.C. 154(b) by 301 days.

(21) Appl. No.: 11/764,613

(22) Filed: Jun. 18, 2007

(65) Prior Publication Data
US 2008/0192542 A1   Aug. 14, 2008

(30) Foreign Application Priority Data
Feb. 13, 2007   (KR) ...................... 10-2007-0014966

(51) Int. Cl.
*G11C 16/04* (2006.01)
(52) U.S. Cl. ............................. 365/185.12; 365/185.17; 365/185.33
(58) Field of Classification Search ............ 365/185.33, 365/185.17, 185.23, 185.12, 185.11
See application file for complete search history.

(56) References Cited

U.S. PATENT DOCUMENTS

| | | | | |
|---|---|---|---|---|
| 5,590,073 A | * | 12/1996 | Arakawa et al. | ....... 365/185.08 |
| 5,777,925 A | * | 7/1998 | Tokushige | ............. 365/185.11 |
| 6,272,044 B2 | * | 8/2001 | Yamamoto et al. | ...... 365/185.17 |
| 6,487,117 B1 | * | 11/2002 | Choi et al. | ............. 365/185.17 |
| 6,678,191 B2 | * | 1/2004 | Lee et al. | ............... 365/185.33 |
| 6,683,817 B2 | * | 1/2004 | Wei et al. | ............... 365/230.03 |
| 6,870,769 B1 | * | 3/2005 | Ha | ......................... 365/185.13 |
| 6,937,513 B1 | | 8/2005 | Desai et al. | |
| 2003/0156454 A1 | | 8/2003 | Wei et al. | |

FOREIGN PATENT DOCUMENTS

| | | |
|---|---|---|
| JP | 06-326277 | 11/1994 |
| JP | 07-153286 | 6/1995 |
| JP | 10-027484 | 1/1998 |
| JP | 2003-099322 | 4/2003 |
| KR | 1020020094354 | 12/2002 |

OTHER PUBLICATIONS

English Abstract for Publication No. 06-326277.
English Abstract for Publication No. 10-027484.
English Abstract for Publication No. 07-153286.
English Abstract for Publication No. 1020020094354.
English Abstract for Publication No. 2003-099322.

* cited by examiner

*Primary Examiner*—Andrew Q Tran
(74) *Attorney, Agent, or Firm*—F. Chau & Associates, LLC (57) ABSTRACT

A memory system includes a memory and a memory controller operating to control the memory. The memory includes a random accessible memory including a memory cell array operable in a random access mode, a NAND flash memory, and a selection circuit making the memory controller operate either one of the random accessible memory or the NAND flash memory.

10 Claims, 6 Drawing Sheets

FLASH MEMORY SYSTEM CAPABLE OF OPERATING IN A RANDOM ACCESS MODE AND DATA READING METHOD THEREOF

CROSS-REFERENCE TO RELATED APPLICATIONS

This application claims priority under 35 U.S.C. §119 to Korean Patent Application No. 10-2007-0014966 filed on Feb. 13, 2007, the entire contents of which are hereby incorporated by reference.

BACKGROUND

1. Technical Field

The present invention relates to a memory system and more particularly, to a NAND flash memory system and a data reading method thereof.

In many computing systems, software modules or programs are executed 'in place'. This technology is generally known as XIP (eXecute-in-place), by which program are directly executed in flash memory for reasons of small main memory size and short boot time in mobile memory systems. XIP applications can be accomplished in flash memory without transferring execution codes to RAM from the flash memory. XIP technology enables reduction of memory requirements from RAMs and multi-executions of many application programs. As NAND flash memory is usually inoperable in XIP-enabled environments, NOR flash memory is normally used for XIP applications.

Many studies are being conducted to provide XIP applications to NAND flash memory. Making NAND flash memory equipped with XIP functions allows them to operate in random accessible modes.

SUMMARY OF THE INVENTION

Exemplary embodiments of the present invention provide a NAND flash memory system capable of executing a random access function and a data reading method thereof.

According to an exemplary embodiment of the present invention, a memory system includes a memory and a memory controller operating to control the memory. The memory includes random accessible memory including a memory cell array enabling a random access, a NAND flash memory, and a selection circuit to select between the random accessible memory and the NAND flash memory.

In an exemplary embodiment, the memory is integrated in one chip.

In an exemplary embodiment, the random accessible memory programs data in single-page units and reads data in the random access mode.

In an exemplary embodiment, the memory cell array of the random accessible memory partially uses a NAND flash memory cell array.

In an exemplary embodiment, the random accessible memory has a memory cell array that is structured as a string including at least one word line.

In an exemplary embodiment, the random accessible memory has a memory cell array that is configured in a first string structure including a word line.

In an exemplary embodiment, the random accessible memory uses a page buffer circuit of the NAND flash memory while programming data.

In an exemplary embodiment, the random accessible memory further includes a sense amplifier circuit for random access and read data.

In an exemplary embodiment, the NAND flash memory includes a memory cell array with 32 word lines in a second string structure.

In an exemplary embodiment, the first string of the random accessible memory is connected to a first bit line and the second string of the NAND flash memory is connected to a second bit line. The selection circuit connects the first bit line with the second bit line.

In an exemplary embodiment, the selection circuit connects the first bit line with the second bit line while programming date into the random accessible memory.

In an exemplary embodiment, the selection circuit conducts the random access mode with disconnecting the first bit line from the second bit line while reading data from the random accessible memory.

In an exemplary embodiment, the selection circuit uses a high-voltage transistor for connecting the first bit line to the second bit line.

In an exemplary embodiment, the random accessible memory and the NAND flash memory share a data line.

In an exemplary embodiment, the selection circuit includes a data line selection circuit to connect a data line with the random accessible memory or the NAND flash memory.

According to an exemplary embodiment of the present invention, a memory system includes a memory and a memory controller operating to control the memory. The memory includes a random accessible memory including a memory cell array enabling random access, and a NAND flash memory. The random accessible memory uses the NAND flash memory to program data in pages.

In an exemplary embodiment, the random accessible memory has a memory cell array that is configured in a first string structure including a word line.

In an exemplary embodiment, the NAND flash memory includes a memory cell array with 32 word lines in a second string structure.

In an exemplary embodiment, the first string of the random accessible memory and the second string of the NAND flash memory are connected to the same bit line.

In an exemplary embodiment, the random accessible memory and the NAND flash memory share a Y-decoder for activating the bit line.

In an exemplary embodiment, the random accessible memory is associated with a sense amplifier circuit placed under the Y-decoder in structure.

In an exemplary embodiment, the memory system is an embedded memory system.

In an exemplary embodiment, the memory is integrated in one chip.

In an exemplary embodiment, the memory system is a smart card.

Exemplary embodiments of the present invention also provide a NAND flash memory including a first memory cell array with a first string structure enabling a random access mode, a second memory cell array with a second string structure enabling random access, and a block selection circuit operating to select a memory field from the first and second memory cell arrays.

In an exemplary embodiment, the block selection circuit selects the first memory cell array as the memory field when stored data are to be read in random access.

In an exemplary embodiment, the first string structure includes one word line.

In an exemplary embodiment, the first string is connected to a first bit line and the second string is connected to a second bit line. The block selection circuit connects the first bit line with the second bit line.

In an exemplary embodiment, the NAND flash memory further includes a sense amplifier circuit detecting data of the first bit Sine, for example, random access data stored in the first memory cell array.

In an exemplary embodiment, the first memory cell array is programmed with data in pages.

In an exemplary embodiment, the first memory cell array shares a page buffer circuit with the second memory cell array and programs data in pages.

In an exemplary embodiment, the block selection circuit connects the first bit line to the second bit line while programming data into the memory cell array.

In an exemplary embodiment, the first and second memory cell arrays share a data line.

In an exemplary embodiment, the block selection circuit includes a data line selection circuit connecting a data line with the first memory cell array or the second memory cell array.

Exemplary embodiments of the present invention further provide a method for reading data in a random accessible NAND flash memory system. This method includes programming data in single-page units, checking whether data to be read are code data, and reading the data in a random access when the data to be read are code data.

In an exemplary embodiment, the code data executes an XIP function.

A further understanding of the nature of the present invention herein may be realized by reference to the remaining portions of the specification and the attached drawings.

BRIEF DESCRIPTION OF THE FIGURES

Non-limiting and non-exhaustive exemplary embodiments of the present invention will be described with reference to the following figures, wherein like reference numerals may refer to like parts throughout the various figures. In the figures.

DETAILED DESCRIPTION OF THE EXEMPLARY EMBODIMENTS

Exemplary embodiments of the present invention will be described below in more detail with reference to the accompanying drawings. The present invention may, however, be embodied in different forms and should not be construed as limited to the exemplary embodiments set forth herein. Like reference numerals may refer to like elements throughout the accompanying figures.

Figure 1:
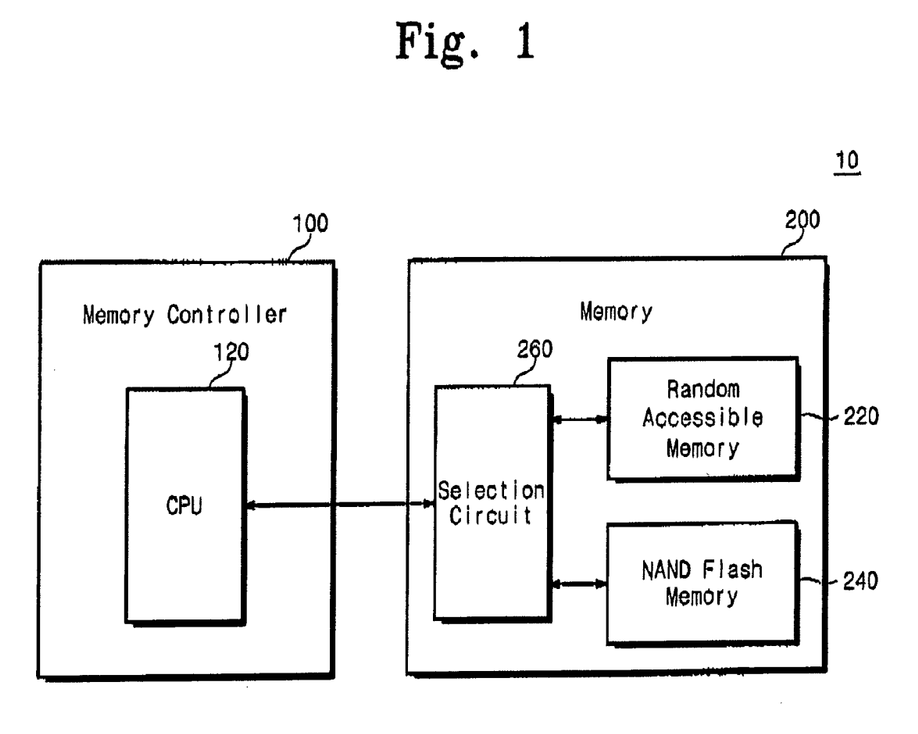
FIG. 1 shows a memory system according to an exemplary embodiment of the present invention.

FIG. 1 shows a memory system 10 according to an exemplary embodiment of the present invention. With reference to FIG. 1, the memory system 10 includes a memory controller 100 and a memory 200. A central processing unit (CPU) 120 of the memory controller 100 operates to generally control the memory 200. The memory 200 includes a random accessible memory 220, a NAND flash memory 240, and a selection circuit 260. The CPU 120 independently controls the random accessible memory 220 and the NAND flash memory 240 of the memory 200. The selection circuit 260 connects the memory controller to the random accessible memory 220 or to the NAND flash memory 240 in compliance with a command of the CPU 120.

In the memory 200, the random accessible memory 220 and the NAND flash memory 240 are integrated in one chip. The random accessible memory 220 includes a memory cell array that is operable in a random access mode. Here, the memory cell array includes nonvolatile memory cells. For example, the random accessible memory 220 may be implemented with a parallel flash memory. This parallel flash memory is constructed in parallel arrangement with memory cells between a bit line and a ground line. The parallel flash memory is able to read or write data from or into an address regardless of the arrangement of the memory cells. The memory cells are accessible in single-byte units. There are several kinds of parallel flash memory, for example, electrically erasable and programmable read-only memory (EEPROMs), NOR flash memory, divided bit-line NOR (DINOR) flash memory, and so on. The random accessible memory 220 may be used with a partial memory cell array of a NAND flash memory. This will be detailed below in conjunction with FIGS. 2, 3, and 5.

The memory system 10, according to an exemplary embodiment of the present invention. Is associated with the selection circuit 260, which is included in the memory 200. The selection circuit 206 respectively controls the random accessible memory 220 and the NAND flash memory 240. This memory system 10 is able to assist an XIP function. Accordingly, a program is executed directly (for example, in place) in the flash memory. The XIP function may reduce an amount of RAM required to execute the application program and many application programs may be executed at a time. The memory system 10 equipped with an XIP function may be employed in a mobile system.

Figure 2:
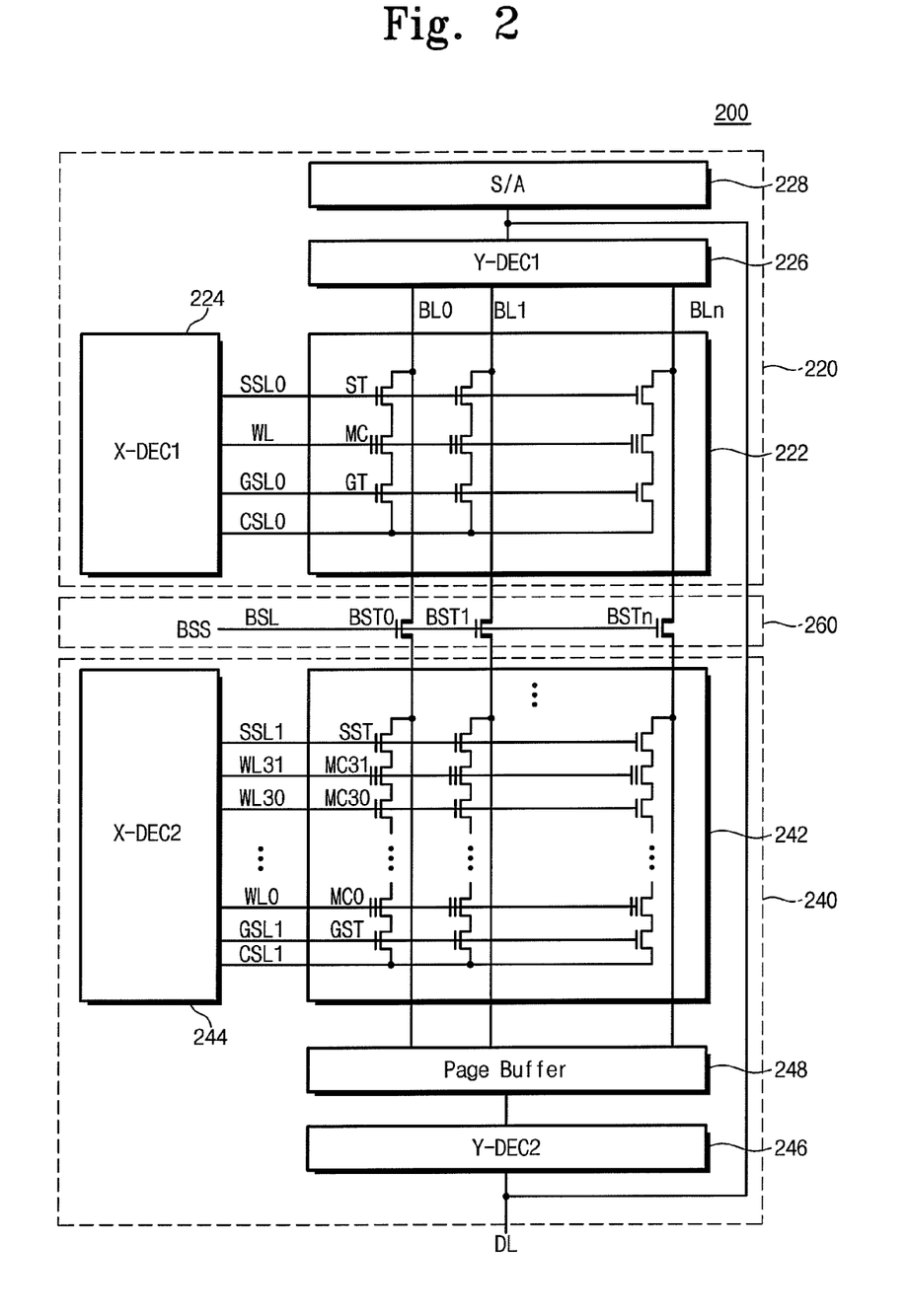
FIG. 2 illustrates the memory shown in FIG. 1 according to an exemplary embodiment of the present invention.
Figure 3:
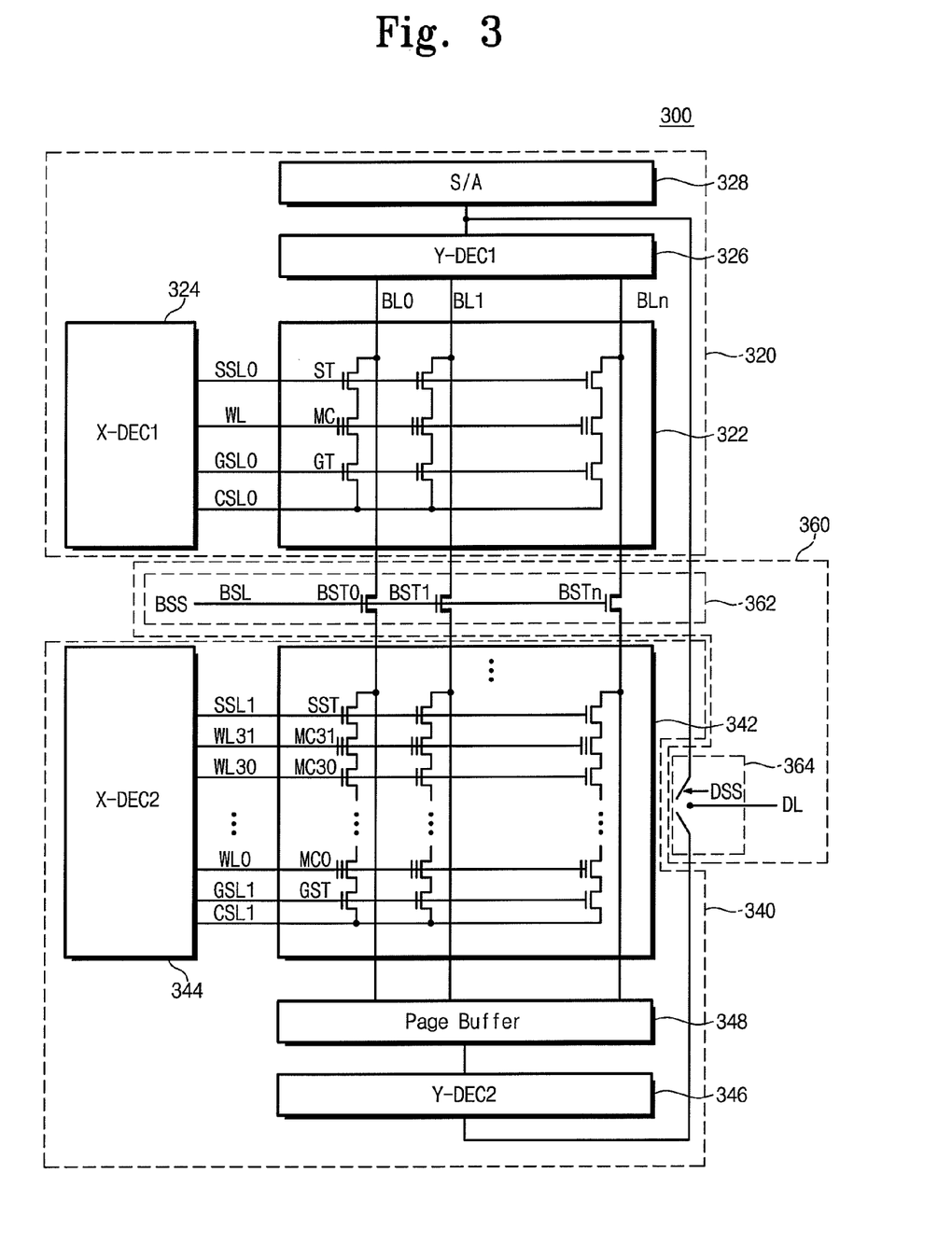
FIG. 3 illustrates the memory shown in FIG. 1 according to an exemplary embodiment of the present invention.
Figure 5:
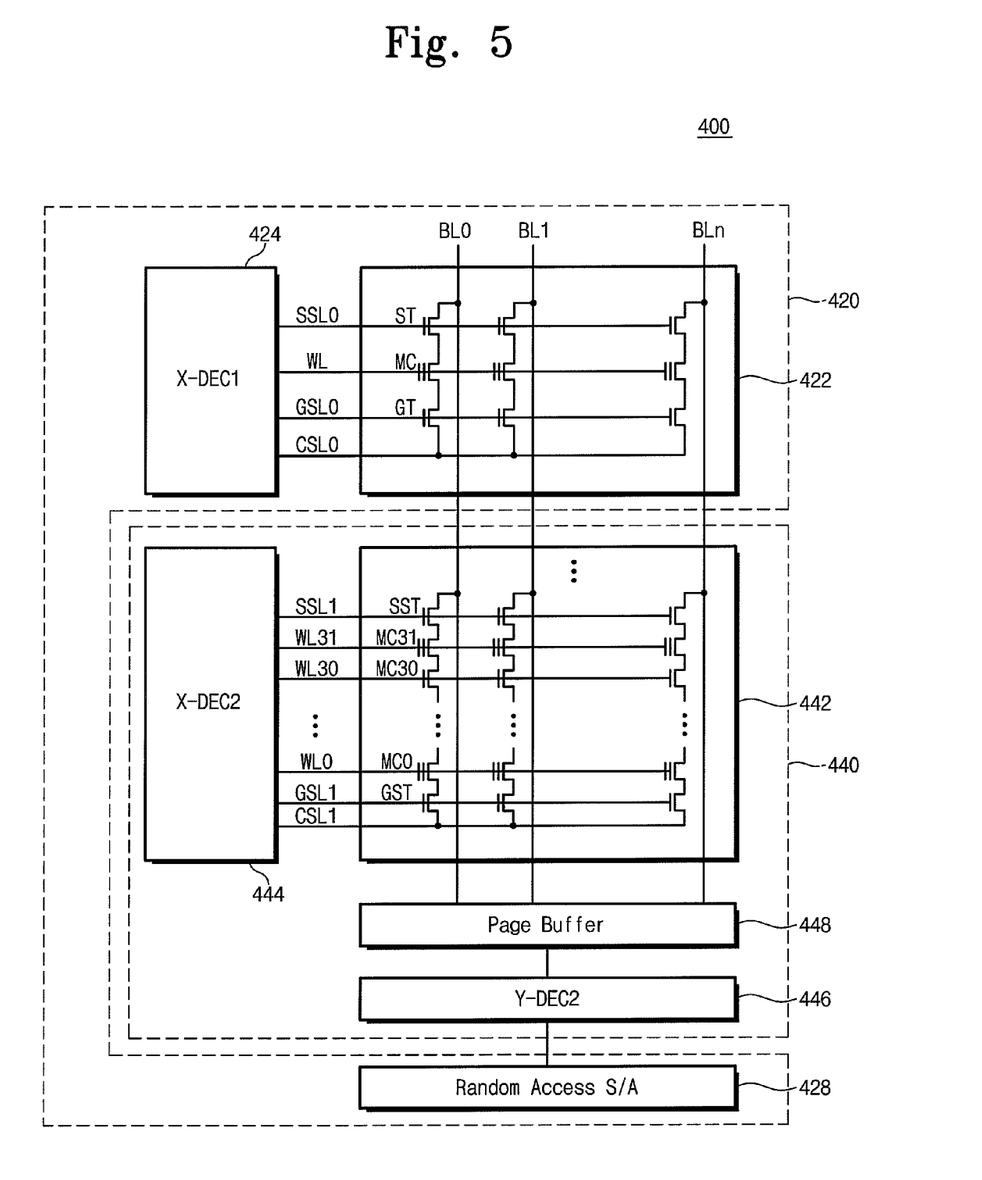
FIG. 5 illustrates the memory shown in FIG. 4 according to an exemplary embodiment of the present invention.

FIGS. 2, 3, and 5 illustrate exemplary embodiments that partially employ a memory cell array of a NAND flash memory for the random accessible memory. For convenience of description, FIGS. 2, 3 and 5 show that a single word line of the NAND flash memory cell array is used for a structure of the random accessible memory. While these exemplary embodiments show the single word line for a structure of the random accessible memory, the present invention need not be so restricted. For example, two or more word lines may be used for the random accessible memory.

FIG. 2 illustrates an exemplary embodiment of the memory 200 shown in FIG. 1. Referring to FIG. 2, the memory 200 includes the random accessible memory 220 and the NAND flash memory 240.

The random accessible memory 220 programs data by the page and reads data in a random access mode. The random accessible memory 220 includes a 1-wordline string memory cell array 222, an X-decoder 224, a Y-decoder 226, and a sense amplifier circuit 228.

The 1-wordline string memory cell array 222 includes pluralities of bit lines BL0-BLn, each of which having a first selection transistor ST, a cell transistor MC, and a second selection transistor GT that are connected in series. The first selection transistor ST corresponds to a string selection transistor SST of a normal NAND flash memory cell array, while the second selection transistor GT corresponds to a ground selection transistor GST of a normal NAND flash memory cell array. The cell transistor MC is formed of a single bit line. The cell transistor MC is supplied with selection signals and word line voltages through two selection signal lines SSL0 and GSL0 and a word line WL.

The X-decoder 224 receives an row address from an address buffer (not shown), and provides selection signals and a word line voltage to the 1-wordline string memory cell array 222 through the selection lines SSL0 and GSL0 and the word line WL.

The Y-decoder 226 receives a column address from the address buffer and activates a corresponding bit line BL.

The sense amplifier circuit 228 detects data of a memory cell connected to an active bit line of the 1-wordline string memory cell array 222.

The NAND flash memory 240 is comprised of a 32-wordline string memory cell array 242, an X-decoder 244, a Y-decoder 246, and a page buffer circuit 248.

The 32-wordline string memory cell array 242 is connected to the 1-wordline string memory cell array 222 of the random accessible memory 220 by way of the selection circuit 260. As illustrated in FIG. 2, a 1-wordline string 223 is connected to a 32-wordline string 243 by way of a block selection transistor BST0.

The X-decoder 244 selects a word line in response to a row address input from an address buffer (not shown) and supplies a word line voltage to the selected word line.

The Y-decoder 246 receives a column address from the address buffer and activates a bit line corresponding thereto.

The page buffer circuit 248 is connected to the 32-wordline string memory cell array 242 through bit lines BL0-BLn. The page buffer circuit 248 stores data loaded from a buffer memory (not shown). Data corresponding to the capacity of one page are loaded into the page buffer circuit 248. The loaded data are programmed in one selected page at a time. In addition, the page buffer circuit 248 reads data from a selected page and temporarily stores the read data therein. Data stored in the page buffer circuit 248 are transferred to the buffer memory in response to a read-enabling signal (not shown).

In the meantime, the page buffer circuit 248 is shared by the 1-wordline and 32-wordline string memory cell arrays 222 and 242 through the bit lines BL0-BLn. The 1-wordline string memory cell array 222 is programmed with data by the page buffer circuit 248 one page at a time.

The selection circuit 260 selects whether to utilize the memory 200 as the random accessible memory 220 for conducting the XIP function or the NAND flash memory 240 for storing normal data. Referring to FIG. 2, the selection circuit 260 includes pluralities of block selection transistors BST0-BSTn. The plural block selection transistors BST0-BSTn are turned on or off in response to a block selection signal BSS transferred through a block selection line BSL. The block selection transistors BST0-BSTn connect or disconnect the 1-wordline string memory cell array 222 to the 32-wordline string memory cell array 242 in response to the block selection signal BSS. The block selection signal BSS is provided from the CPU 120 of the memory controller 100.

For example, the block selection transistors BST0-BSTn are turned on while programming data into the 1-wordline string memory cell array 222. The 1-wordline string memory cell array 222 is programmed by the page buffer circuit 248. The block selection transistors BST0-BSTn are turned off while reading data from the 1-wordline string memory cell array 222. The sense amplifier circuit 228 reads data from the 1-wordline string memory cell array 222. Thus, the random accessible memory 220 is able to random access the 1-wordline string memory cell array 222.

The plural block selection transistors BST0-BSTn are associated with high-voltage transistors. These high-voltage transistors help in preventing the 1-wordline string memory cell array 222 from being inadvertently erased while erasing the 32-wordline string memory cell array 242.

The block selection signal BSS is provided from the CPU 120, according to the present exemplary embodiment, but the present invention is not so limited. The selection circuit 260 may further include a block selection signal generator (not shown) for supplying the block selection signal BSS. The block selection signal generator analyses address and data transferred to the memory controller 100 and generates the block selection signal BSS after determining which memory is related to corresponding address and data. For example, if there is a requirement for programming code data from the memory controller 100 in order to operate the NAND flash memory 240, the block selection signal generator outputs the block selection signal BSS of logical high level and programs the code data corresponding to the 1-wordline string memory cell array 222.

While the NAND flash memory 240, according to the present exemplary embodiment, is comprised of the 32-wordline string 243, the present invention is not so limited.

In the memory 200, according to exemplary embodiments of the present invention, data to be random accessed are stored in the 1-wordline string memory cell array 222 of the random accessible memory 220 and normal data are stored in the 32-wordline string memory cell array 242 of the NAND flash memory 240. The random accessible memory 220 and the NAND flash memory 240 are independently controllable by the selection circuit 260. In addition, the memory 200, according to exemplary embodiments of the present invention, is able to read data from the random accessible memory 220 while programming data into the NAND flash memory 240.

In the memory 200, according to exemplary embodiments of the present invention, the random accessible memory 220 uses the page buffer circuit 248 of the NAND flash memory 240 in programming data thereto.

While FIG. 2 shows the random accessible memory 220 and the NAND flash memory 240 sharing a common data line DL according to an exemplary embodiment, the present invention is not so limited. FIG. 3 illustrates a memory 300 shown in FIG. 1 according to another exemplary embodiment of the present invention. Referring to FIG. 3, a random accessible memory 320 and a NAND flash memory 340 are alternatively connected to a data line DL.

The random accessible memory 320 and the NAND flash memory 340 are similar to the corresponding elements 220 and 240 shown in FIG. 2.

A selection circuit 360 includes a block selection circuit 362 and a data line selection circuit 364. The block selection circuit 362 operates to electrically connect or disconnect the 1-wordline string memory cell array 322 and the 32-wordline string memory cell array 342 in response to a block selection signal BSS. The data line selection circuit 364 operates to connect the data line DL with the random accessible memory 320 or the NAND flash memory 340 in response to a data line selection signal DSS. The data line selection signal DSS is provided from the memory controller 100.

Figure 4:
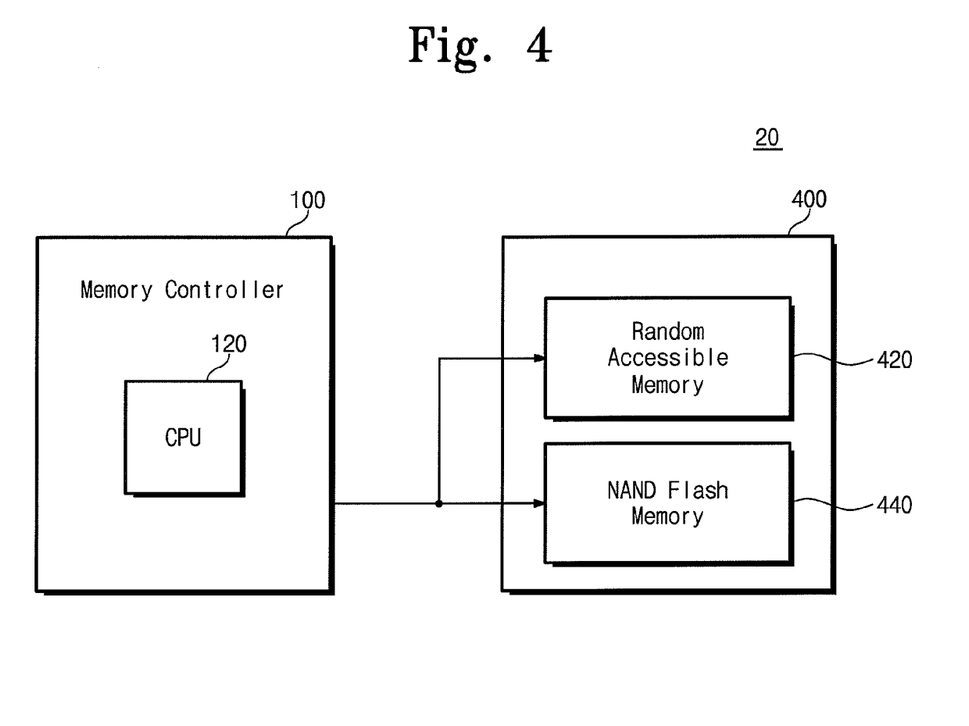
FIG. 4 shows a memory system according to an exemplary embodiment of the present invention.

The memory system 10 of FIG. 1 includes the selection circuit 260 in the memory 200, but the present invention is not limited to this exemplary embodiment. FIG. 4 shows a memory system 20 according to an exemplary embodiment of the present invention. A memory 400 of the memory system 20 may lack a selection circuit 260 as shown in FIG. 1. The memory 400 includes a random accessible memory 420 and a NAND flash memory 440. The random accessible memory 420 utilizes several circuit units of the NAND flash memory 440 while writing or reading data therein or therefrom. The memory system 20 may further include a memory controller 100 having a CPU 120, as explained above with respect to FIG. 1.

FIG. 5 illustrates an embodiment of the memory 400 shown in FIG. 4. Referring to FIG. 5, the memory 400 includes the random accessible memory 420 and the NAND flash memory 440.

The random accessible memory 420 is comprised of a 1-wordline string memory cell array 422, an X-decoder 424, and a random access sense amplifier circuit 428. The random accessible memory 420 shares a Y-decoder 446 together with the NAND flash memory 440. The random access sense amplifier 428 may be located under the Y-decoder 446.

Figure 6:
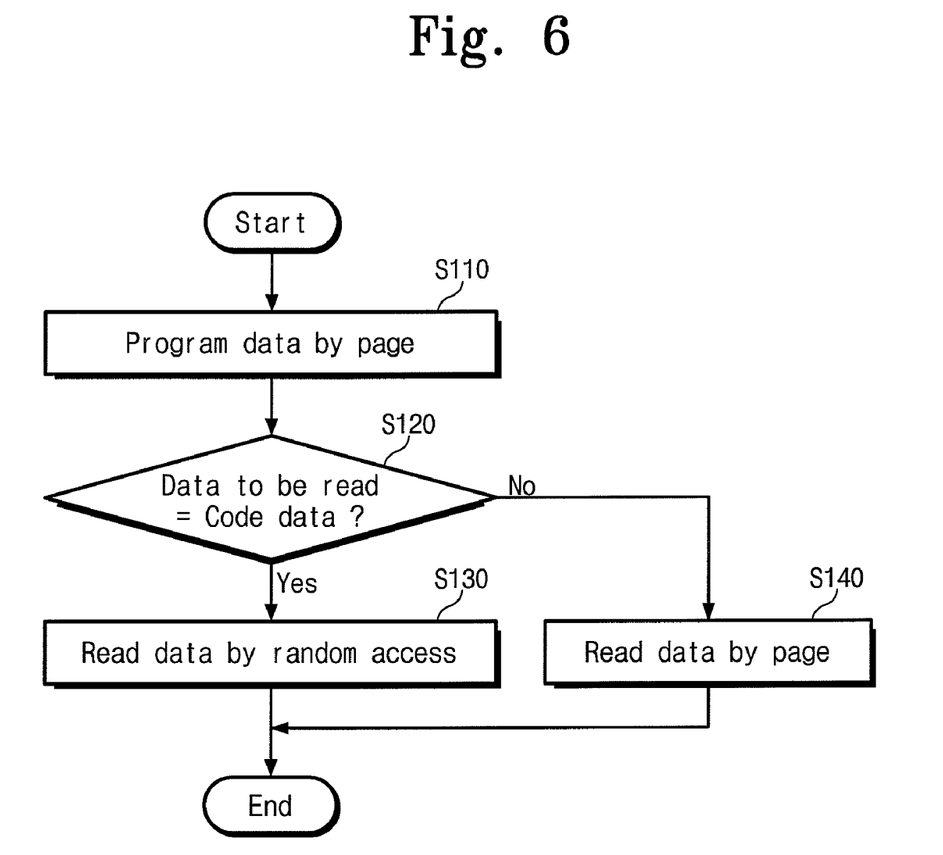
FIG. 6 shows a procedure of reading data in the memory system according to an exemplary embodiment of the present invention.

FIG. 6 shows a procedure of reading data in the memory system according to an exemplary embodiment of the present invention. Referring to FIG. 6, the memory system programs data therein in single-page units. The memory system reads data in a random access mode according to a kind of data, or in single-page units. Methods of programming and reading data in conjunction with FIGS. 1 and 6 are described below for convenience of explanation.

First, in a step S110, data are programmed into the memory 200. During this step, all data are programmed in single-page units. The random accessible memory 220 and the NAND flash memory 240 are programmed in single-page units. For example, code data are programmed into the random accessible memory 220 in the unit of page. The code data are provided to control the NAND flash memory 240.

Next, in a step S120, before reading the data, it is determined whether data to be read stored in the memory 200 are code data. If the data to be read stored in the memory 200 are code data, the memory controller 100 generates and transfers a signal for making the selection circuit 260 select the random accessible memory 220.

In a step S130, the selection circuit 260 operates to select the random accessible memory 220 in response to the signal transferred from the memory controller 100. The memory controller 100 reads the code data from the random accessible memory 220 in the random access mode.

In a step S140, if the data to be read are not code data and are instead normal data, the memory controller 100 reads data from the NAND flash memory 240 in single-page units.

Memory systems according to exemplary embodiments of the present invention may be applicable to embedded memory systems.

As stated above, the memory system and data reading method according to exemplary embodiments of the present invention are able to accomplish the XIP applications even with the NAND flash memory by programming data in single-page units and including the random accessible memory capable of reading data in a random access mode.

While exemplary embodiments of the present invention have been described in detail, it should be understood that various changes, substitutions and alterations may be made herein without departing from the scope of the invention.

What is claimed is:

1. A flash memory device comprising:
   a NOR memory cell array enabling a random access comprising a 1-wordline string memory cell array that is operable in a random access mode, an X-decoder, a Y-decoder, and a sense amplifier circuit;
   a NAND memory cell array comprising a 32-wordline string memory cell array, an X-decoder, a Y-decoder, and a page buffer circuit; and
   a random access mode selection circuit, comprising a plurality of block selection transistors, operating to select whether to utilize the flash memory device as a random accessible memory for conducting an execute-in-place function or as a flash memory for storing normal data,
   wherein the NOR memory cell array programs data by a page unit and reads data in the random access mode, and
   wherein the block selection transistors are turned on while programming data into the 1-wordline string memory cell array and the 1-wordline string memory cell array is programmed by the page buffer circuit, and the block selection transistors are turned off while reading data from the 1-wordline string memory cell array and the sense amplifier circuit reads data from the 1-wordline string memory cell array.

2. The flash memory device as set forth in claim 1, wherein the random access mode selection circuit selects the NOR memory cell array as the selected memory cell array in the random access mode.

3. The flash memory device as set forth in claim 1, wherein the 1-wordline string memory cell array is connected to a first bit line and the 32-wordline string memory cell array is connected to a second bit line,
   wherein the random access mode selection circuit selects one of the first bit line and the second bit line as a bit line for a read operation.

4. The flash memory device as set forth in claim 3, wherein the sense amplifier circuit detects data of the first bit line to randomly access data stored in the 1-wordline string memory cell array.

5. The flash memory device as set forth in claim 3, wherein the random access mode selection circuit connects the first bit line to the second bit line while programming data into the 1-wordline string memory cell array.

6. The flash memory device as set forth in claim 1, wherein the 1-wordline string memory cell array is programmed with data in single-page units.

7. The flash memory device as set forth in claim 6, wherein the 1-wordline string memory cell array shares the page buffer circuit with the 32-wordline string memory cell array to program data in single-page units.

8. The flash memory device as set forth in claim 1, wherein the 1-wordline string memory cell array and the 32-wordline string memory cell array share a data line.

9. The flash memory device as set forth in claim 1, wherein a data line selection circuit connects a data line with either the 1-wordline string memory cell array or the 32-wordline string memory cell array.

10. The flash memory device of claim 1, wherein the 1-wordline string memory cell array additionally comprises a plurality of bitlines, each having a first selection transistor, a cell transistor, and a second selection transistor that are connected in series, the first selection transistor corresponding to a string selection transistor of the 32-wordline string memory cell array, the second selection transistor corresponding to a ground selection transistor of the 32-wordline string memory cell array, the cell transistor formed of a single bitline and is supplied with selection signals and word line voltages through two selection signal lines and a word line.

* * * * *